US007615132B2

(12) United States Patent
Yasui et al.

(10) Patent No.: US 7,615,132 B2
(45) Date of Patent: Nov. 10, 2009

(54) PLASMA PROCESSING APPARATUS HAVING HIGH FREQUENCY POWER SOURCE WITH SAG COMPENSATION FUNCTION AND PLASMA PROCESSING METHOD

(75) Inventors: Naoki Yasui, Kudamatsu (JP); Seiichi Watanabe, Hofu (JP); Masahiro Sumiya, Kudamatsu (JP); Hitoshi Tamura, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 101 days.

(21) Appl. No.: 10/795,353

(22) Filed: Mar. 9, 2004

(65) Prior Publication Data

US 2005/0081999 A1    Apr. 21, 2005

(30) Foreign Application Priority Data

Oct. 17, 2003    (JP)    ............................. 2003-357828

(51) Int. Cl.
- C23C 16/00    (2006.01)
- C23F 1/00    (2006.01)
- H01L 21/306    (2006.01)

(52) U.S. Cl. .......................... 156/345.47; 156/345.43; 156/345.44; 156/345.28; 118/723 E

(58) Field of Classification Search ............ 156/345.28, 156/345.43; 118/723 E
See application file for complete search history.

(56) References Cited

U.S. PATENT DOCUMENTS 3,636,379 A * 1/1972 Moe et al. ................... 327/260
4,963,239 A * 10/1990 Shimamura et al. ..... 204/192.12
5,683,538 A * 11/1997 O'Neill et al. .......... 156/345.28
7,236,754 B2 * 6/2007 Sorrells et al. .............. 455/118
2001/0009139 A1 * 7/2001 Shan et al. ................ 118/723 E
2002/0038631 A1 * 4/2002 Sumiya et al. ............ 118/723 E
2003/0068531 A1 * 4/2003 Hori et al. ................... 428/696
2003/0153180 A1 * 8/2003 Marunaka et al. ........... 438/680

FOREIGN PATENT DOCUMENTS

| JP | 61-243184 | 10/1986 |
|----|-----------|---------|
| JP | 64-015927 | 1/1989 |
| JP | 04-335560 | 11/1992 |
| JP | 05-174995 | 7/1993 |
| JP | 09-129621 | 5/1997 |
| JP | 10-226893 | 8/1998 |
| JP | 2002-222801 | 8/2002 |

* cited by examiner

Primary Examiner—Parviz Hassanzadeh
Assistant Examiner—Rakesh K Dhingra
(74) Attorney, Agent, or Firm—Antonelli, Terry, Stout & Kraus, LLP.

(57) ABSTRACT

A plasma processing apparatus suitable for high-speed and high-definition etching is provided. By applying to a wafer chucking electrode 9 a voltage waveform in which an absolute value of high frequency voltage increases with time and switching between a positive voltage and a negative voltage occurs, a rectangular high frequency voltage is caused to be generated in the wafer 10, with the result that the duty ratio of the rectangular high frequency voltage decreases and that the high energy ion ratio in the energy distribution of ions incident on the wafer increases. Therefore, high efficiency and high accuracy etching becomes possible, providing the advantage that the material selection ratio is improved.

8 Claims, 14 Drawing Sheets

FROM 15 OF FIG. 1

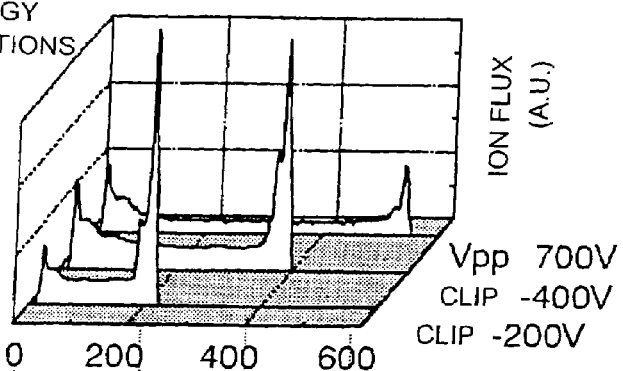
FIG. 15(A) ION ENERGY DISTRIBUTIONS
FIG. 15(B) VOLTAGE WAVEFORMS
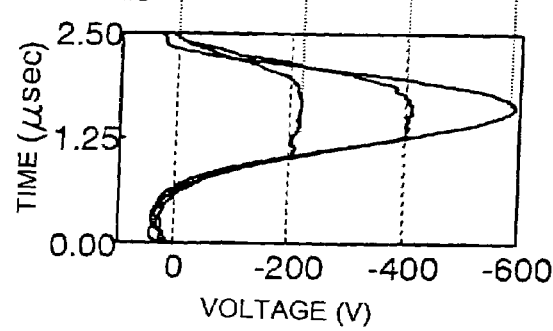
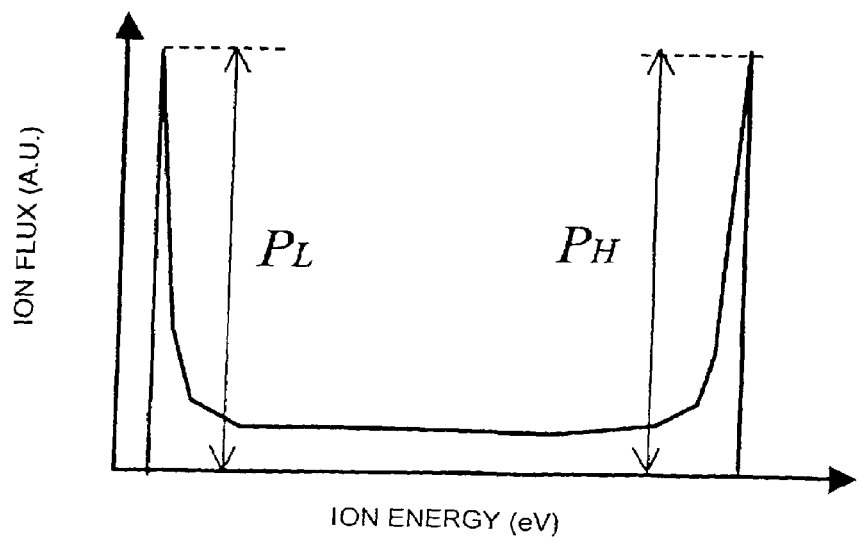
FIG. 16

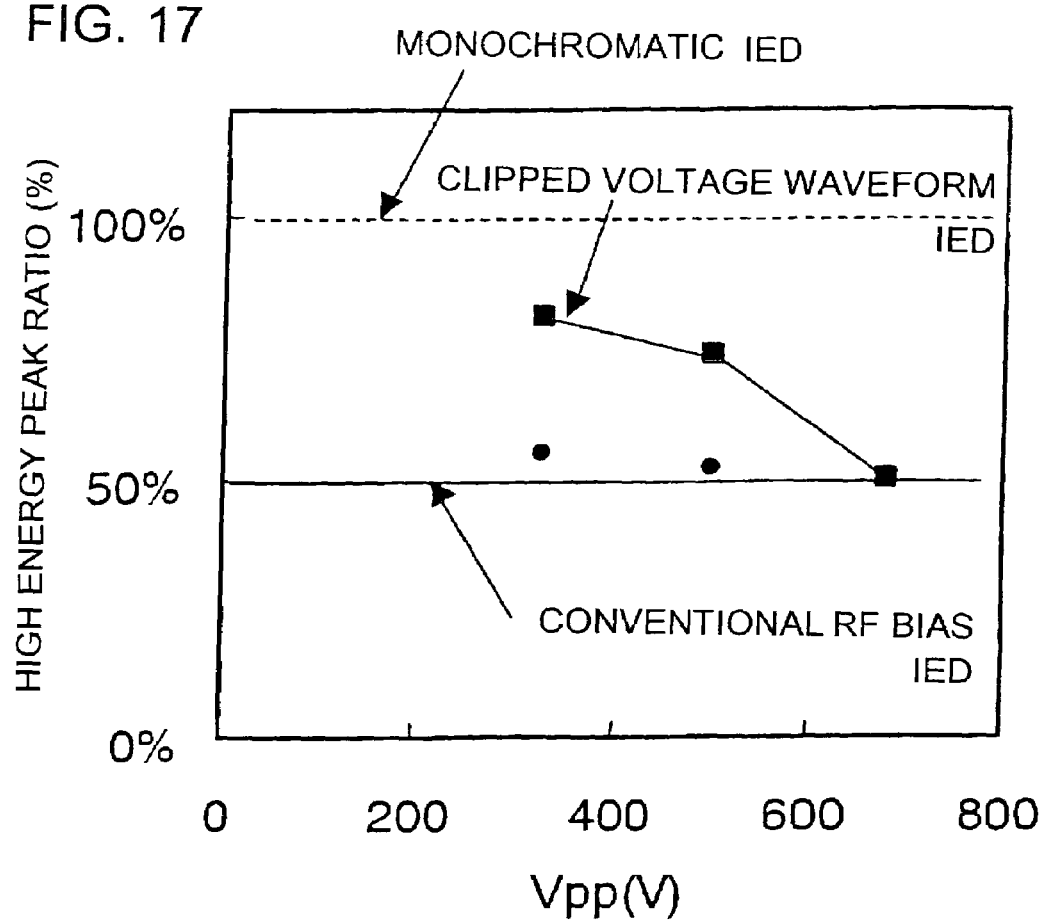

FIG. 18(A) ION ENERGY DISTRIBUTION
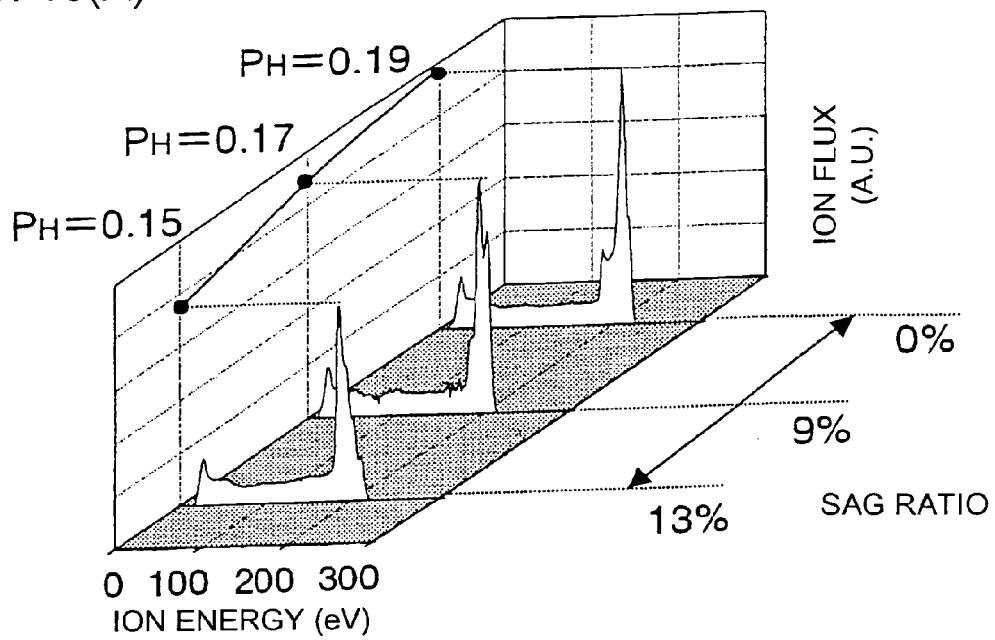
FIG. 18(B) WAFER VOLTAGE
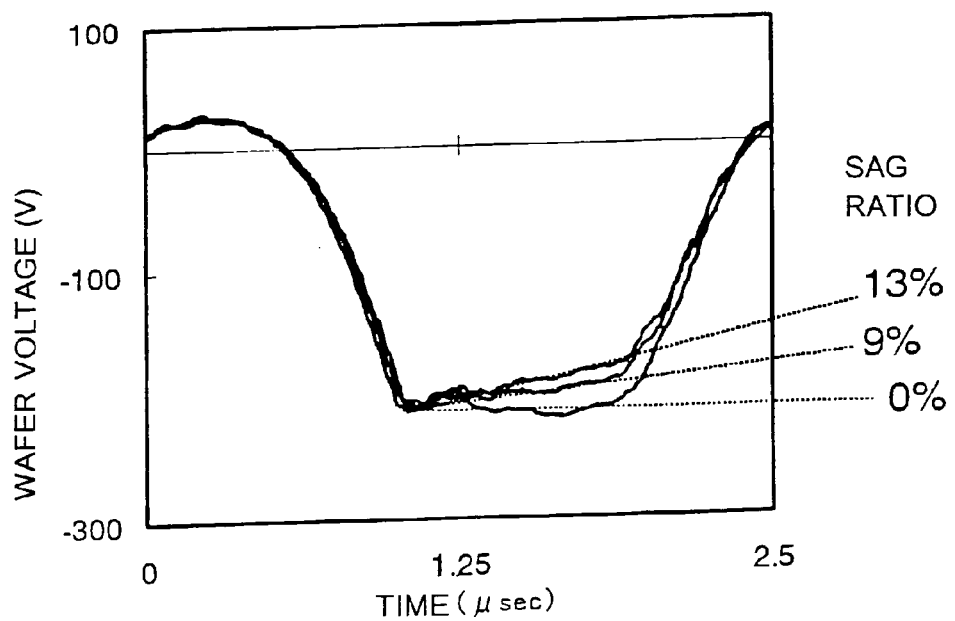

PLASMA PROCESSING APPARATUS HAVING HIGH FREQUENCY POWER SOURCE WITH SAG COMPENSATION FUNCTION AND PLASMA PROCESSING METHOD The present application claims priority from Japanese patent application JP2003-247828 filed on Oct. 17, 2003, the content of which is hereby incorporated by reference into this application.

BACKGROUND OF THE INVENTION

1. Field of the Invention

The present invention relates to a plasma processing apparatus and, more particularly, to a plasma processing apparatus which is suitable for etching a workpiece, such as a semiconductor element substrate, by using plasma and applying a high frequency voltage to the substrate.

2. Description of the Related Art

In conventional plasma processing apparatus, for example, as described in Patent Document 1, a high frequency voltage having a sine waveform was applied to an electrode on which a wafer, which is the object to be processed, is placed. In this case, as shown in FIG. 12, the ion energy distribution on the wafer has a saddle peak distribution which has two peaks, one on the high energy side and one on the low energy side. Although ions of the high energy peak contribute to etching, ions of the low energy peak scarcely contribute to etching. In a case where a high frequency voltage having a sine waveform is applied, the ratio of the high energy peak height to the low energy peak height is almost 1:1. Even when the high frequency voltage is changed, this high/low energy ion ratio scarcely changes, posing the problem that the etching efficiency is low.

Patent Document 1: Japanese Patent Laid-Open No. 5-174995

The object of the present invention is to provide a plasma processing apparatus capable of high etching rate and high performance etching.

BRIEF SUMMARY OF THE INVENTION

In order to achieve the above object, the present invention provides a high frequency application means which ensures that a high frequency voltage waveform generated in an object to be processed becomes rectangular. Via a high frequency voltage waveform control circuit (a sag correction circuit) which changes with time an absolute value of voltage on at least either of the positive side and negative side of a rectangular high frequency voltage, a high frequency power source which generates a rectangle wave is connected to an electrode on which an object to be processed is placed. The high frequency voltage waveform control circuit (the sag correction circuit) is automatically controlled with respect to a monitored quantity so that a rectangular wave is applied to the object to be processed. As a result, a rectangular high frequency voltage is applied to the object to be processed. Ions incident on the wafer, which is the object to be processed, are accelerated by an electric field in an ion sheath formed on the wafer. This electric field in an ion sheath has a bearing on a potential difference between the plasma potential on the ion sheath and the wafer potential and the thickness of the ion sheath. When a rectangular high frequency voltage is applied to the wafer, low energy ions become incident on the wafer during the period of application of a positive voltage, and high energy ions become incident on the wafer during the period of application of a negative voltage. Therefore, by varying the duty ratio of a rectangular high frequency voltage, it is possible to vary the ratio of high energy ions and low energy ions which become incident on the wafer. As a result, it becomes possible to perform high etching rate and high performance etching.

According to the present invention, by applying, to a wafer chucking electrode 9, a voltage waveform in which an absolute value of high frequency voltage increases with time and switching between a positive voltage and a negative voltage occurs, a rectangular high frequency voltage is caused to be generated in the wafer 10, and as a result, etching with high efficiency and high performance becomes possible, providing the advantage that the etching selectivity of materials is improved.

BRIEF DESCRIPTION OF THE DRAWINGS

FIG. 15 shows a wafer voltage waveform of a wafer 10 obtained by sag-correction and clipping a sine wave voltage waveform and an energy distribution diagram of ions incident on a wafer 10 in each wafer voltage waveform;

FIG. 16 is a diagram explaining the high energy ion ratio in an embodiment of the present invention;

FIG. 17 is a diagram showing the Vpp dependence of the high energy peak ratio in an embodiment of the present invention;

FIG. 18 shows a wafer voltage waveform of a wafer 10 obtained by controlling the ratio of amount of sag in a sine wave voltage waveform and an energy distribution diagram of ions incident on a wafer 10 in each wafer voltage waveform.

DETAILED DESCRIPTION OF THE PREFERRED EMBODIMENTS

The first embodiment of the present invention will be described with reference to FIG. 1 to FIG. 12.

Embodiment 1

Figure 1:
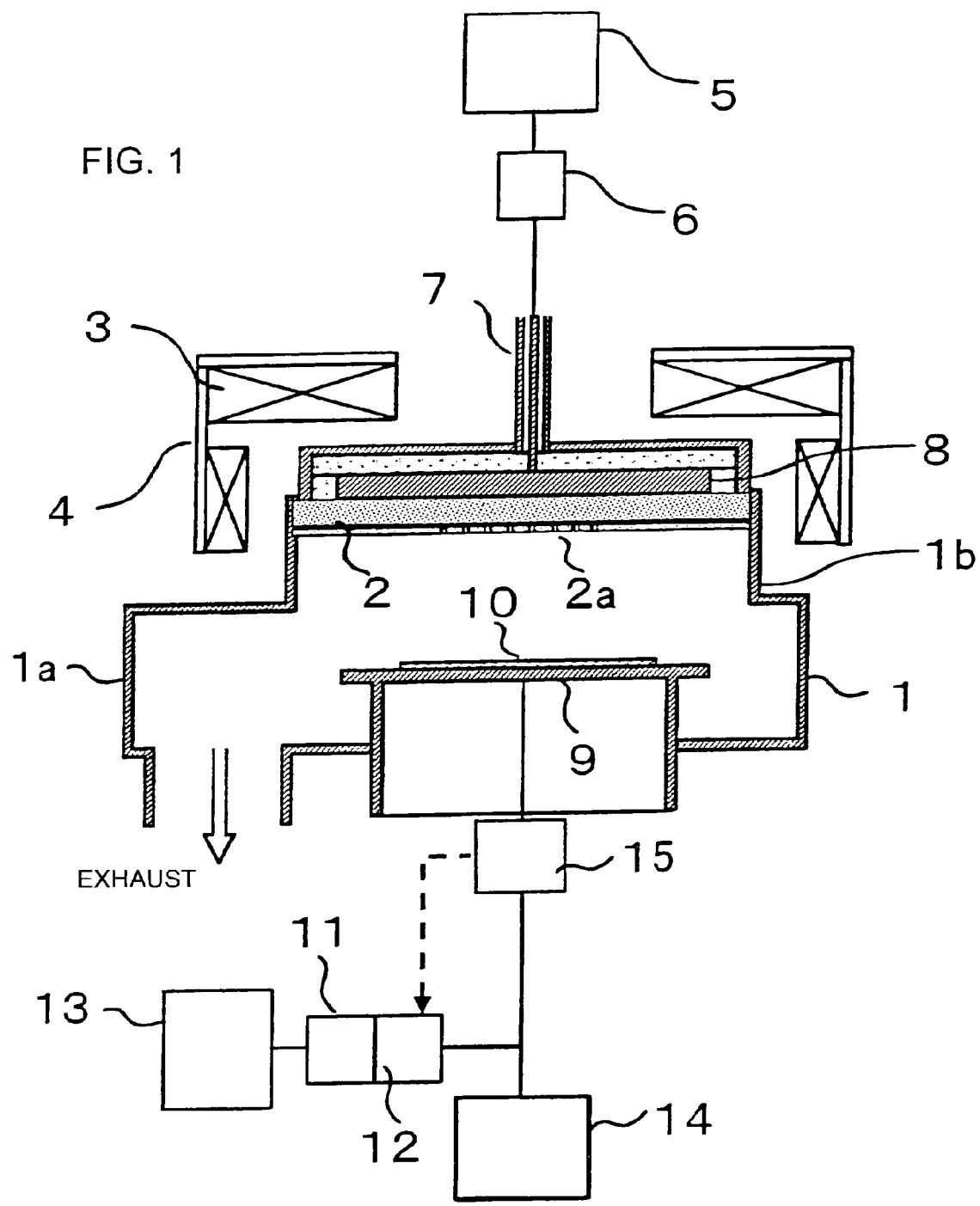
FIG. 1 is a longitudinal cross-sectional view of a magnetic field UHF etching apparatus, which is an embodiment of a plasma processing apparatus of the present invention.

FIG. 1 shows a magnetic field UHF etching apparatus, which is an embodiment of a plasma processing apparatus of the present invention. After depressurizing the interior of a processing chamber 1 defined by a block 1a, a discharge tube 1b and a quartz window 2 via a vacuum system (not shown), an etching gas is supplied to the interior of the processing chamber 1 via a gas supply device (not shown) and the pressure of the processing chamber 1 is adjusted to a desired process condition. The processing chamber 1 is located within a magnetic field region generated by a coil 3 and a yoke 4. A UHF wave, which is generated by a high frequency power source 5 and has a frequency of 450 MHz in this example, travels through an impedance matching network 6, propagates through a coaxial wave guide (cable) 7, passes through the quartz window 2 from an antenna 8, and enters the interior of the processing chamber 1. Due to an interaction with the magnetic field, the UHF wave generates plasmas within the processing chamber 1. A wafer 10 placed on a wafer chucking electrode 9 is subjected to etching treatment by the plasmas generated by this UHF wave. In order to control the etching shape of the wafer 10, a rectangular high frequency power source 13 is connected to the wafer chucking electrode 9 via a matching device 11 and a high frequency voltage waveform control circuit (a sag correction circuit) 12, thereby making it possible to apply a high frequency voltage. An electrode current monitor 15 is connected to a high frequency voltage application portion of the wafer chucking electrode for measuring a current waveform generated in the electrode. A measured electrode current is used as a control signal of the high frequency voltage waveform control circuit (sag correction circuit) 12.

A DC power source 14 is connected to the wafer chucking electrode 9, the surface of the electrode being covered with a dielectric film (not shown). As a result, the wafer 10 is chucked by electrostatic force on the electrode via dielectric film. A shower plate 2a made of quartz is provided under the quartz window 2. The etching gas flows between the quartz window 2 and the shower plate 2a and is introduced into the processing chamber 1 through a gas introduction port provided in the center of the shower plate 2a. Because the etching gas is supplied directly above the wafer 10, a highly uniform etching is possible. In the interior of the processing chamber 1, a quartz cover is provided in order to prevent pollution.

Figure 2:
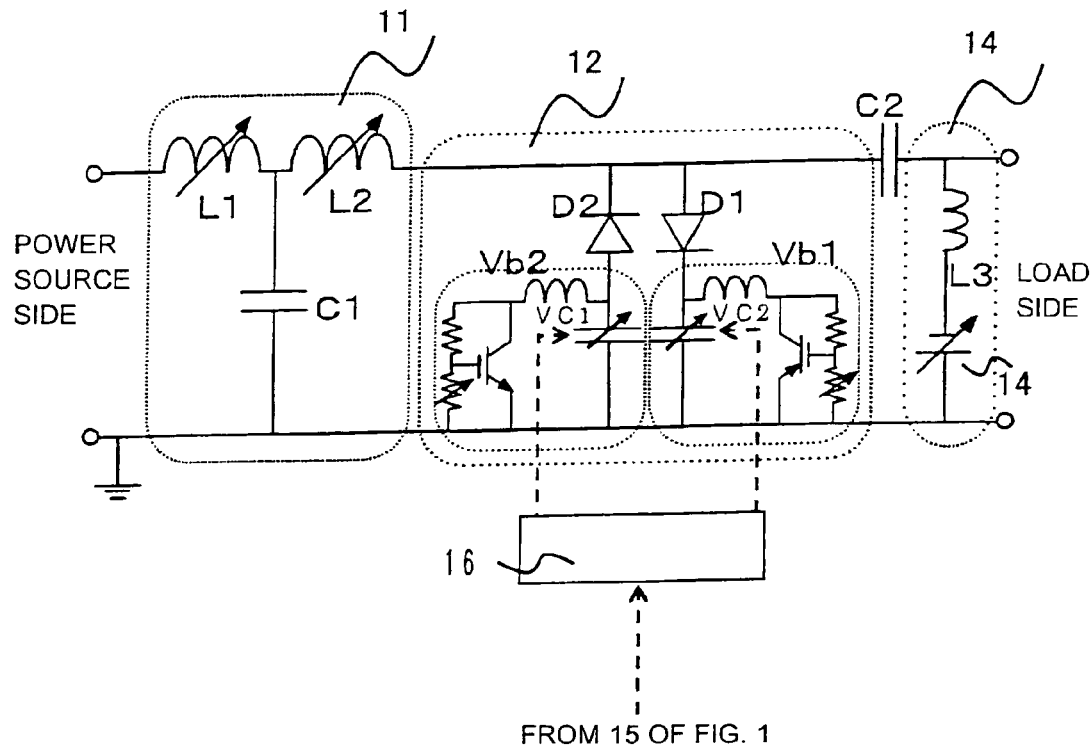
FIG. 2 is an explanatory diagram of a circuit configuration of an impedance matching network 11 connected to a wafer chucking electrode 9, a high frequency voltage waveform control circuit (a sag correction circuit) 12 and a DC power source 14 according to an embodiment of the present invention.

FIG. 2 shows an example of a circuit configuration of the impedance matching network 11 connected to the wafer chucking electrode 9, the high frequency voltage waveform control circuit (sag correction circuit) 12 and the DC power source 14. The impedance matching network 11, which is constituted by an inductor and a capacitor, requires frequency characteristics of a wide band to keep the rectangular voltage waveform input from a rectangular high frequency power source 13. The impedance converter uses a high frequency transformer, for example. The high frequency voltage waveform control circuit (sag correction circuit) 12 is composed of a semiconductor element, such as a diode and an FET, and a capacitor. Basically, the high frequency voltage waveform control circuit (sag correction circuit) 12 can clip the rf voltage waveforms at any voltage. The high frequency voltage waveform control circuit (sag correction circuit) 12 contains diodes D1, D2 and variable capacitance capacitors VC1, VC2 connected in series thereto. The high frequency voltage waveform control circuit (sag correction circuit) 12 ensures that a change occurs from a waveform which is clipped flat by the capacitance of the capacitors VC1, VC2 to a waveform in which an absolute value of voltage increases with time. The high frequency voltage waveform control circuit (sag correction circuit) 12 is not limited to the circuit shown in FIG. 2, and any circuit can be used if it can clip a waveform in such a method that an absolute value of high frequency voltage increases with time, for example, like an integral circuit or a phase control circuit. Furthermore, an automatic control circuit 16, which can vary the capacitance of the capacitors according to a monitored quantity, is connected to VC1, VC2. Although in FIG. 1, a monitored quantity is a current obtained from the electrode current monitor 15 installed on the electrode, the monitored quantity can be set to any one of a voltage generated in the object to be processed, a current which flows into the object to be processed, a voltage of the wafer chucking electrode, a power applied to the object to be processed and an output power of the high frequency power source. In FIG. 2, VC1 and VC2 are controlled so that the waveform of the electrode current becomes closest to a rectangular wave. The high frequency voltage whose waveform has been clipped is applied to the wafer chucking electrode 9 via capacitor C2 which blocks a DC current. The DC power source 14 is connected to the wafer chucking electrode 9 via an inductor L3. This inductor L3 prevents the DC power source from high frequency voltage.

Figure 3:
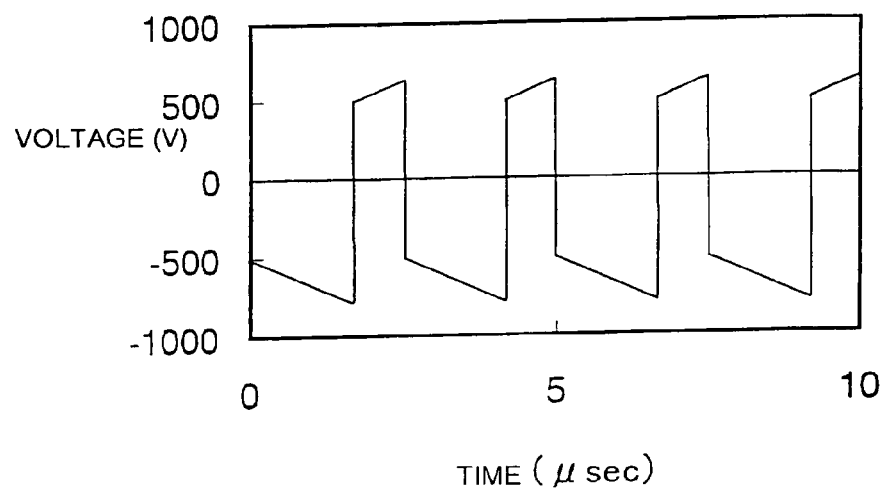
FIG. 3 is a diagram of a high frequency voltage waveform applied to a wafer chucking electrode 9 according to an embodiment of the present invention.
Figure 4:
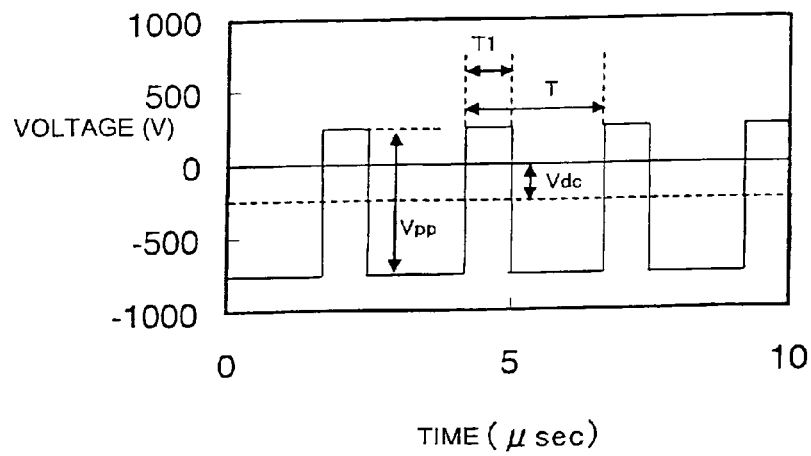
FIG. 4 is a diagram of a high frequency voltage waveform in a wafer 10 according to an embodiment of the present invention.
Figure 5:
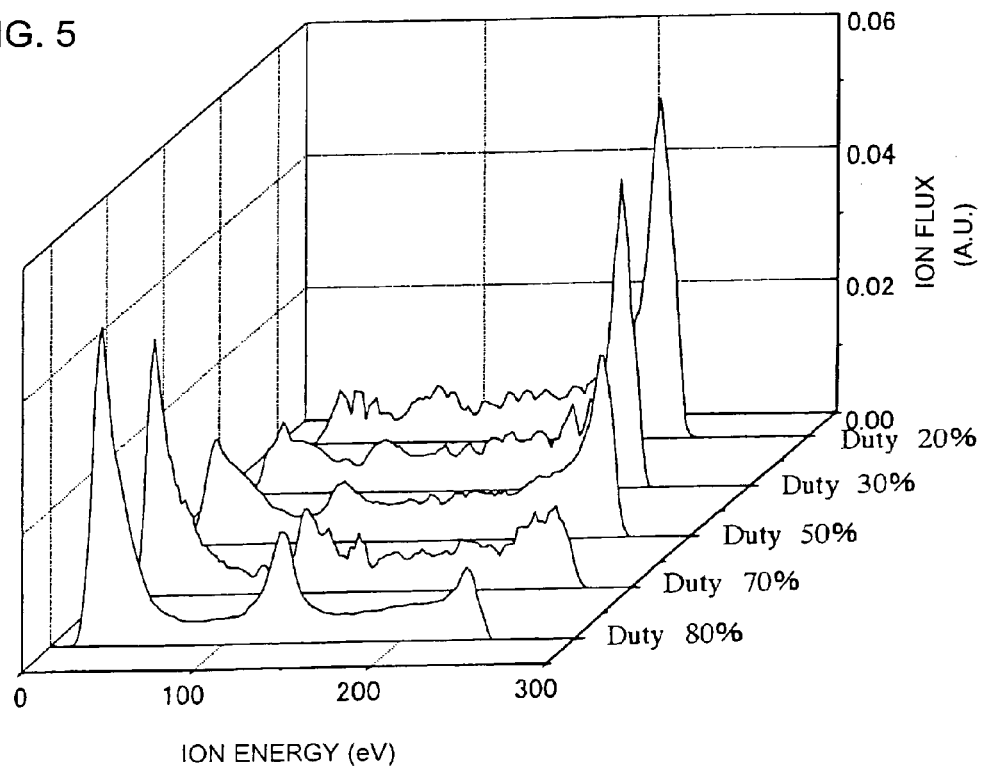
FIG. 5 is an energy distribution diagram of ions incident on a wafer in a case where the duty ratio of a rectangular high frequency voltage is varied according to an embodiment of the present invention.

FIG. 3 shows a high frequency voltage waveform applied to the wafer chucking electrode 9, and FIG. 4 shows a high frequency voltage waveform in the wafer 10. In this case, a frequency of the high frequency voltage is 400 kHz. FIG. 5 shows the energy distribution of ions incident on a wafer in a case where the duty ratio of a rectangular high frequency voltage is varied. In this case, as shown in FIG. 4, $T_1/T$ is defined as duty ratio wherein $T_1$ is positive voltage and T is a period in the high frequency voltage waveform. When the duty ratio is 50%, as with the case of FIG. 10 where a sine wave high frequency voltage is applied, the ratio of ions on the high energy side peak height to ions on the low energy side peak height is almost 1:1. However, when the duty ratio is reduced, the proportion of ions on the high energy side increases and when inversely the duty ratio is increased, the proportion of ions on the low energy side increases. If the energy of ions increases, the reaction efficiency of etching (the chemical sputtering ratio) increases in proportion. Therefore, the larger the amount of ions on the high energy side, the higher the etching rate. In other words, because the ion energy distribution is made monochromatic, it is possible to perform processing, with the etching shape being vertical and with high accuracy. For example, vertical shape and high performance working in gate etching is possible. Furthermore, because the relationship between ion energy and the chemical sputtering ratio differs depending on the object to be etched, by selecting optimum ion energy, it is possible to improve the selective etching ratio of a plurality of objects to be etched. For example, it is possible to improve the etching selectivity ratio of a hard mask in the etching of a low dielectric constant (Low-k) insulating film and the selective etching ratio with respect to an ultrathin oxide film of the substrate in gate etching. In the etching of a low dielectric constant (Low-k) insulating film, the frequency of the high frequency power source was set to 800 KHz.

Figure 6:
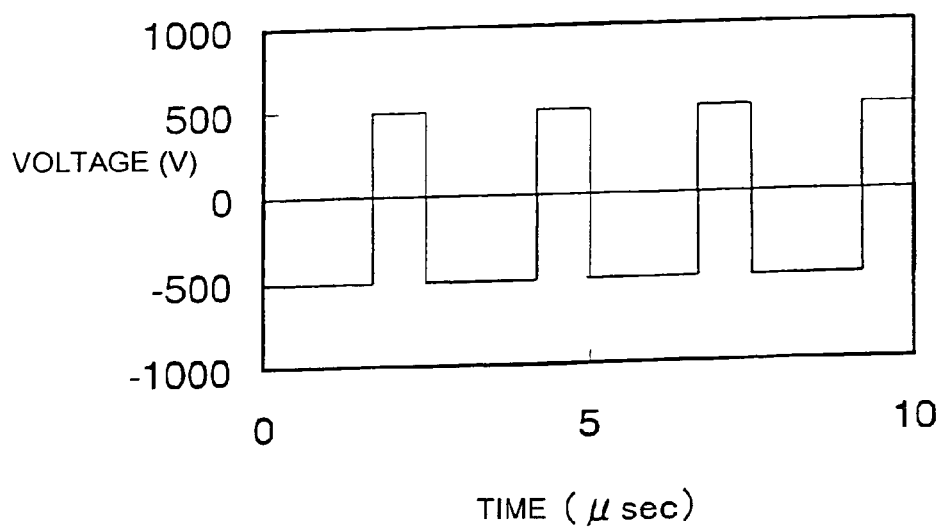
FIG. 6 is a diagram of a rectangular high frequency voltage waveform applied to a wafer chucking electrode 9 in a comparative example.
Figure 7:
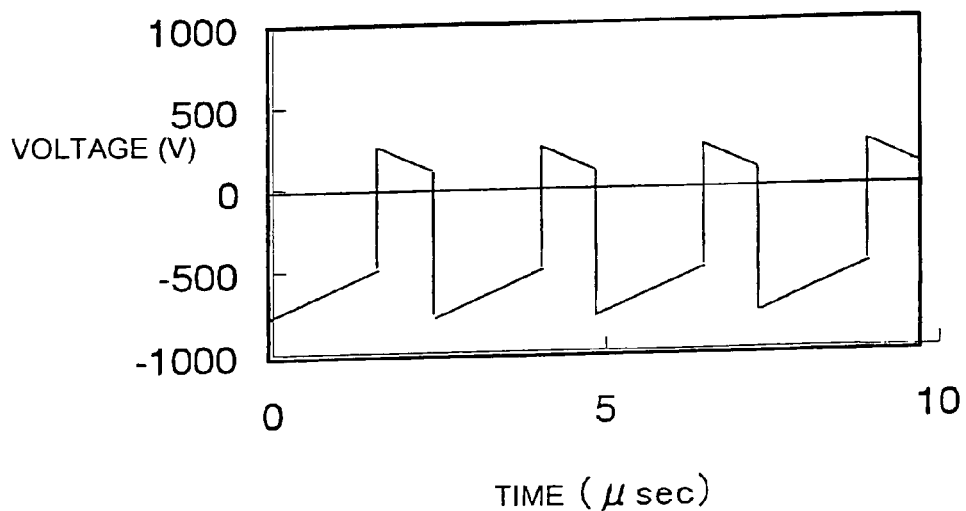
FIG. 7 is a diagram of a high frequency voltage waveform in a wafer 10 in a case where a rectangular high frequency voltage is applied to a wafer chucking electrode 9 in a comparative example.
Figure 8:
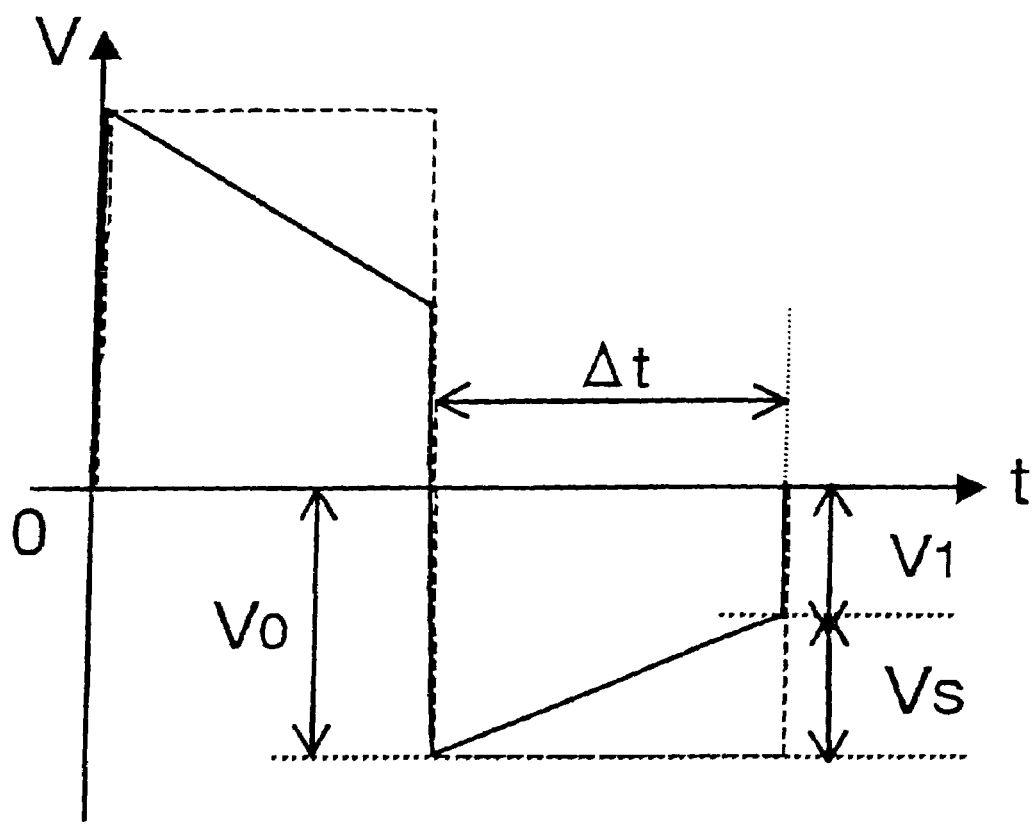
FIG. 8 is an explanatory diagram of the definition of the amount of sag of a rectangular wave according to an embodiment of the present invention.

In a case where a rectangular high frequency voltage as shown in FIG. 6 is applied to the wafer chucking electrode 9, the high frequency voltage in the wafer 10 has a waveform as shown in FIG. 7. That is, the absolute value of high frequency voltage decreases with time (this phenomenon is hereinafter called a sag). The sag is defined as shown in FIG. 8. When the amplitude of a rectangular wave voltage waveform is denoted by $V_o$ (V) and the amount of sag by $V_s$ (V), sag ratio (%) is defined by the following equation:

[Formula 1]

$$\text{Sag ratio } (\%) = \frac{V_s}{V_o} \times 100 \quad (1)$$

Figure 9:
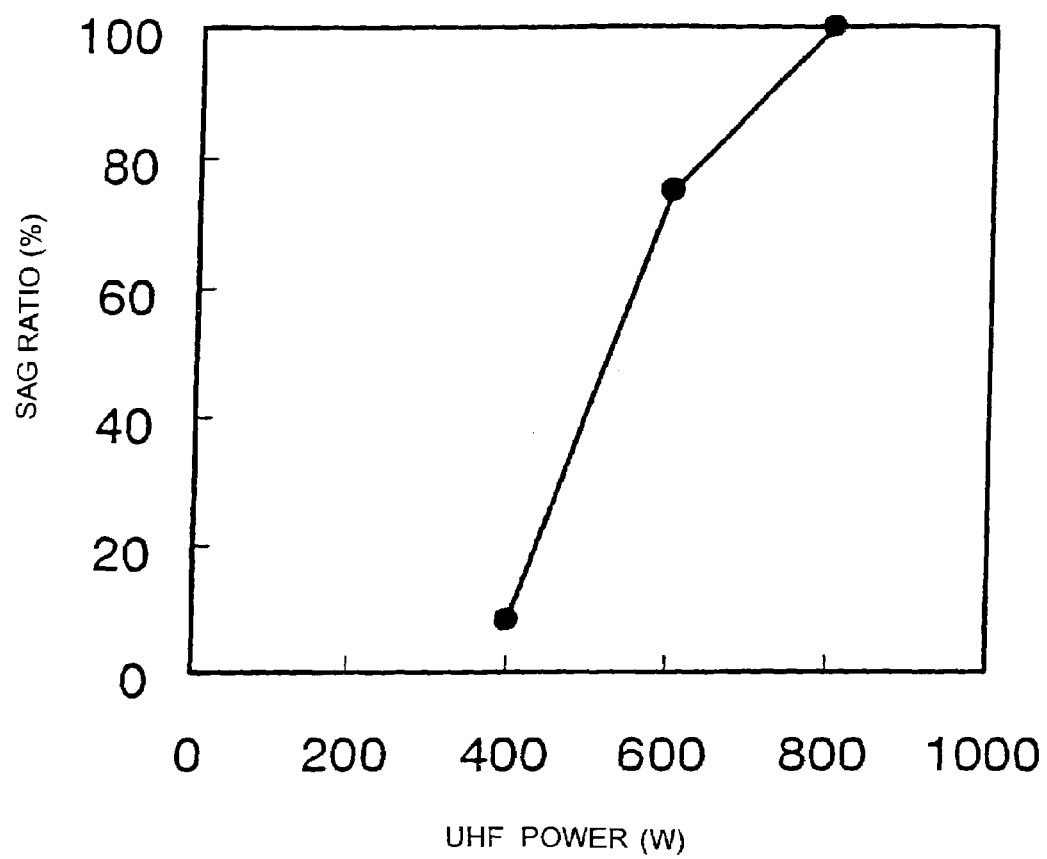
FIG. 9 is a graph showing the relationship between the ratio of amount of sag and the UHF output in a voltage waveform of a wafer 10 according to an embodiment of the present invention.
Figure 10:
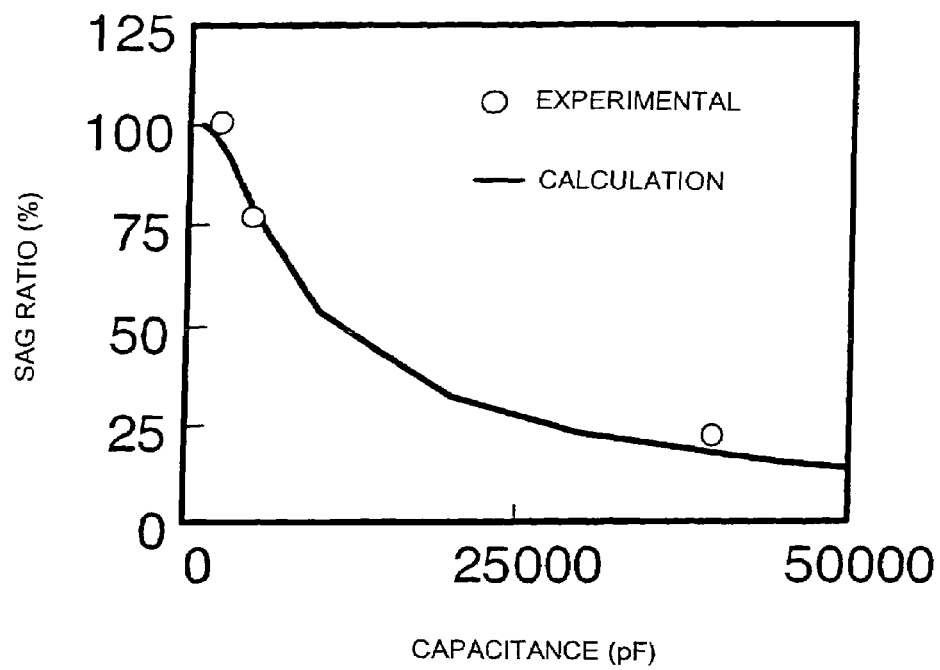
FIG. 10 is a graph showing the relationship between the ratio of amount of sag and the capacitance of a capacitor in a voltage waveform of a wafer 10 according to an embodiment of the present invention.

FIG. 9 shows the UHF power dependence of the ratio on the of amount of sag. When the plasma density increases by increasing the UHF power, the sag ratio increases. FIG. 10 shows the dependence of sag ratio on the capacitance of a capacitor formed by a dielectric film for an electrostatic chuck etc. When the capacitance of a capacitor is increased, sag ratio decreases. From the foregoing, it can be said that an effective differentiation circuit, which is formed by the capacitance of a capacitor of a dielectric film for an electrostatic chuck etc. provided on the surface of the wafer chucking electrode 9 and the plasma resistance of formed bulk plasmas, is the cause of the sag. When the resistance is denoted by R and the capacitor is denoted by C, the sag $V_s$ in a differentiation circuit is generally given by the following equation:

[Formula 2]

$$V_s = V_o - V_o \times exp(-\Delta t/RC) \quad (2)$$

Figure 11:
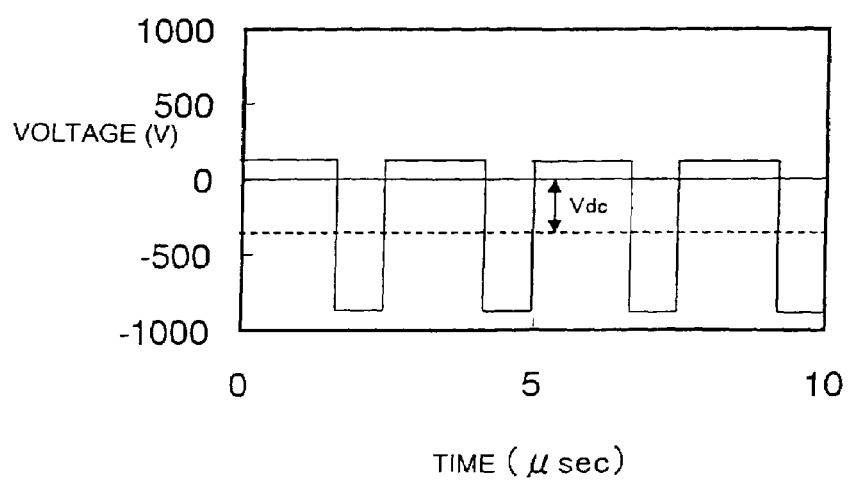
FIG. 11 is a diagram of a voltage waveform in a wafer 10 in a case where the duty ratio $T_1/T$ of a rectangular wave is increased to 50% or greater according to an embodiment of the present invention.
Figure 12:
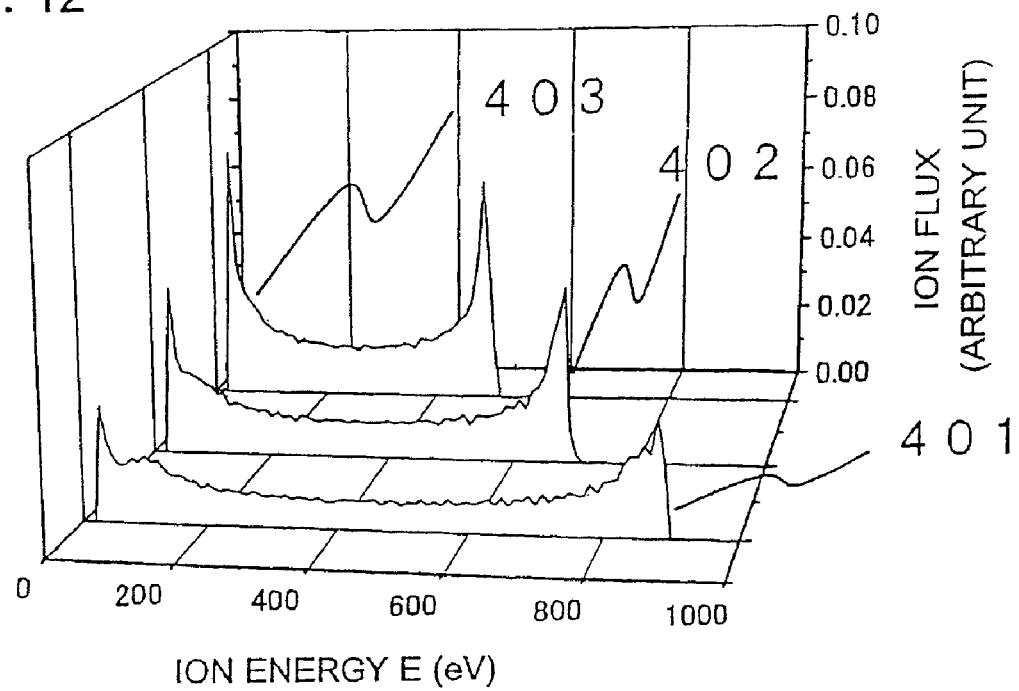
FIG. 12 is an explanatory diagram of the energy distribution of ions incident on a wafer in a case where a high frequency voltage with a sine waveform is applied to an electrode on which a wafer is to be placed in a conventional method.

FIG. 11 shows the result of a calculation of the dependence of the ratio of the amount of sag on the capacitance of a condenser when the plasma resistance is constant. When the high frequency voltage in the wafer 10 has a waveform with a high ratio of the amount of sag as shown in FIG. 7, the ion energy distribution is a broad one in which the energy width at a high energy peak and a low energy peak increases and the quantity of ions at the peaks decreases. For this reason, the etching rate, the working accuracy and the selective etching ratio of materials decrease. In order to perform what is called a sag correction in which an absolute value of such a high frequency voltage decreases with time, it is necessary to perform waveform clipping so that an absolute value of a high frequency voltage increases with time due to the action of the high frequency voltage waveform control circuit (sag correction circuit) 12 and to apply a high frequency voltage to the wafer chucking electrode 9. Because the plasma resistance differs depending on etching conditions, the amount of sag also differs. In order to generate a rectangular high frequency voltage in the wafer 10 as shown in FIG. 4, it is necessary to automatically control the high frequency voltage waveform control circuit (the sag correction circuit) 12. In the present method, the high frequency voltage wave form control circuit (the sag correction circuit) 12 is automatically controlled by using a parameter correlated to the amount of sag occurring in the wafer as a monitored quantity. The high frequency voltage wave form control circuit (the sag correction circuit) 12 may also be automatically controlled by using a computed value of a monitored quantity.

As described above, by applying, to a wafer chucking electrode 9, a voltage waveform in which an absolute value of high frequency voltage increases with time and switching between a positive voltage and a negative voltage occurs, a rectangular high frequency voltage is caused to be generated in the wafer 10, with the result that high efficiency and high performance etching becomes possible, providing the advantage that the selectivity etching ratio of materials is improved.

FIG. 11 shows a voltage waveform in the wafer 10 when the duty ratio $T_1/T$ of a rectangular waveform is increased to 50% or greater. The higher the duty ratio is, the higher an absolute value Vdc of the DC voltage component of a high frequency voltage becomes. That is, a positive voltage decreases. In general, a plasma potential is a positive voltage, and the plasma potential when the voltage in the wafer 10 is a positive voltage, is approximately 20 V above the potential of the wafer 10, whereas the plasma potential at a negative voltage is about 20V. Since the processing chamber 1 is grounded, an ion sheath is formed near the inner surface of the processing chamber 1 and a high frequency voltage corresponding to the plasma potential is applied to the ion sheath. Since ions accelerated by the electrical field of this ion sheath sputter the wall surface of the inner processing chamber, the wafer 10 is polluted with metal, posing the problem that the electrical properties of devices deteriorate eventually. Furthermore, in general, the lower the ratio of the area of the wafer 10 to which a high frequency voltage is applied to the effective ground area, the higher the $V_{dc}/V_{pp}$ ratio, which provides an index of the application efficiency of a high frequency voltage (as shown in FIG. 4, $V_{pp}$ is a peak-to-peak voltage of a high frequency voltage). When the diameter of the wafer 10 is increased from 200 mm to 300 mm, the ratio of the area of the wafer 10 to the effective ground area increases and hence the plasma potential increases, it has become important to take measures against the pollution with metal. In the case of the present invention, the larger the duty ratio becomes, the more the plasma potential can be reduced, providing the advantage that the pollution with metal can be prevented.

Although in each of the above embodiments a description was given of the case where a high frequency voltage is applied to the wafer 10, there is no restriction to the case so long as where a high frequency voltage is applied to the interior of the processing chamber. For example, in the case of an insulating film etching apparatus, by installing a silicon plate in a position opposite to the wafer 10 and applying a high frequency voltage, excessive fluorine radicals in the plasma generated by a fluorocarbon gas are removed and the selecting etching ratio of a mask is improved. In the case of such an apparatus, the same action and effect can also be obtained by ensuring that the voltage in the silicon plate obtains a rectangular high frequency voltage waveform. Also, the same effect is obtained by ensuring that the voltage in both the wafer 10 and the silicon plate obtains a rectangular high frequency voltage waveform, and a greater effect (in particular, the effect of suppressing the plasma potential) is obtained by adopting the same frequency of the high frequency voltage of the two and controlling a phase difference in the voltage of the two (particularly, a phase difference of about 180 degrees). Particularly in the case of an insulating film etching apparatus, because a high frequency voltage of high output is applied to the wafer 10, the plasma potential increases and the side wall of the processing chamber 1 is sputtered and plasmas are diffused to the lower part of the processing chamber 1, posing the problem of occurrence of contaminants. However, in the case of this embodiment, the plasma potential can be suppressed, which is effective in reducing the formation of contaminants, providing the advantage of an improvement in the operation rate of the apparatus and an increase in yield.

Although the impedance matching network 11 was used in the above embodiments, for the sake of simplification, it is also possible to replace the impedance matching network 11 with a high frequency transformer or exclude the impedance matching network 11 if the matching with the plasma load can be ensured to a certain degree. Also, the same action and effect can be obtained, for the sake of simplification, by use of an arbitrary signal generator and a high frequency power amplifier, wherein a voltage waveform in which an absolute value of high frequency voltage increases with time as shown in FIG. 3 is applied to the wafer chucking electrode 9. Although in the above embodiments a description was given by using a rectangular wave as an ideal case, almost the same action and effect can be obtained even by using a trapezoidal wave or similar waves having a waveform which is a little disturbed due to frequency characteristics.

Embodiment 2

Figure 13:
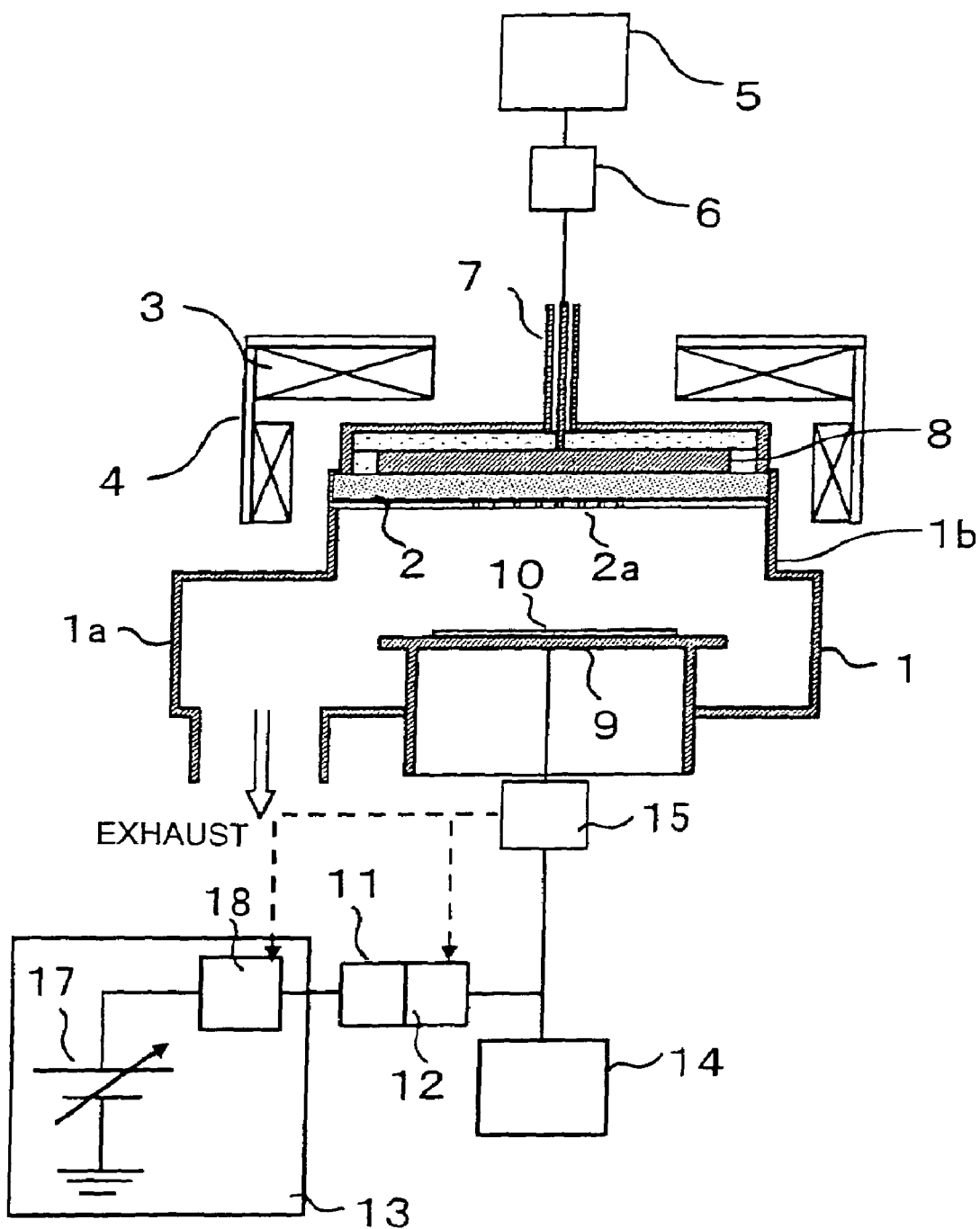
FIG. 13 is a longitudinal cross-sectional view of a magnetic field UHF etching apparatus, which is an embodiment of a plasma processing apparatus of the present invention.
Figure 14:
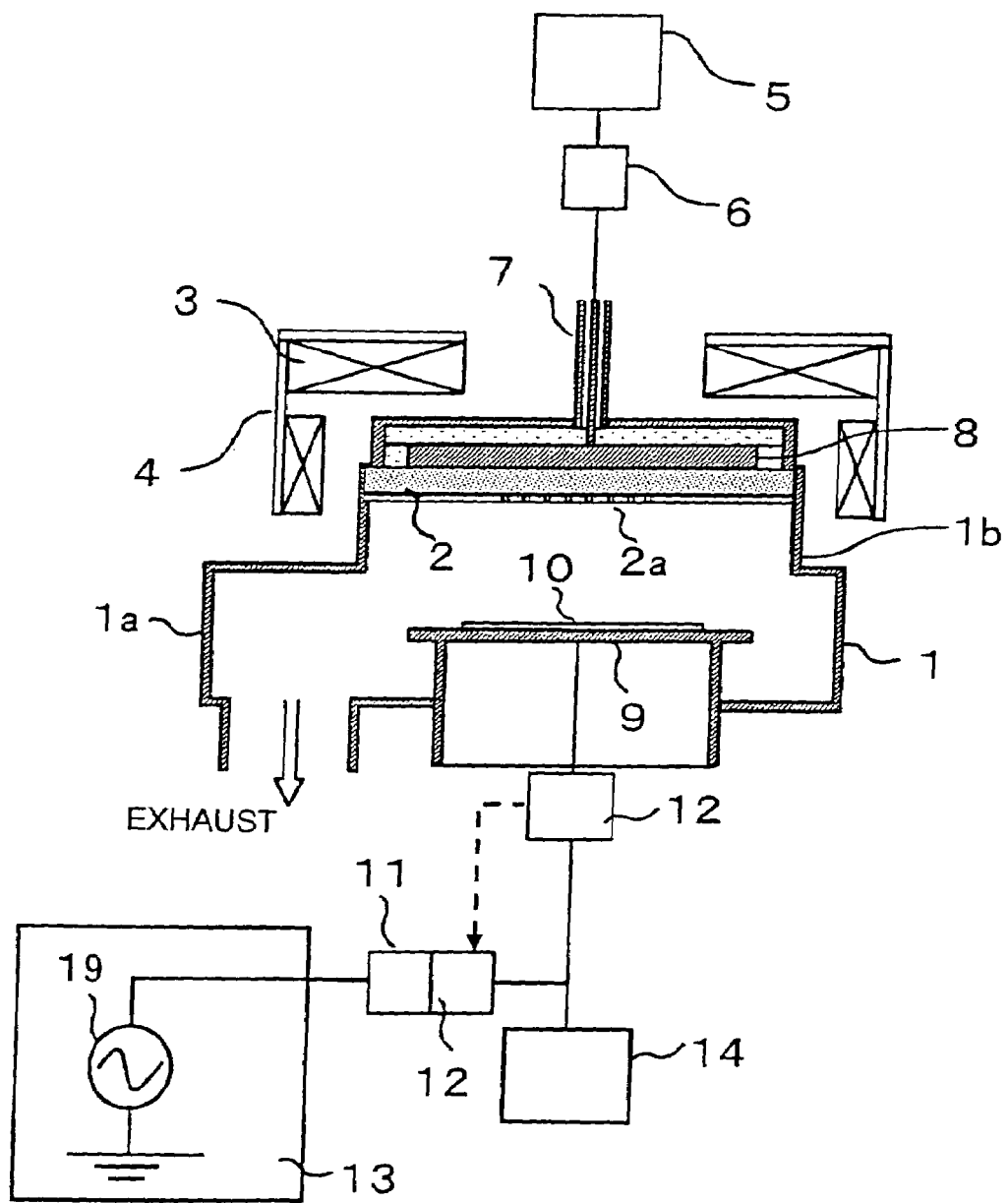
FIG. 14 is a longitudinal cross-sectional view of a magnetic field UHF etching apparatus, which is an embodiment of a plasma processing apparatus of the present invention.

The second embodiment of the present invention will be described with reference to FIG. 13. In this figure, the same reference numerals as in FIG. 1 indicate the same parts and hence the descriptions of these parts are omitted. Points of this figure which are different from FIG. 1 will be described below. The rectangular high frequency power source 13 is constituted by a DC power source 17 and a switching circuit 18 (a chopper circuit). A pulse waveform can be output by repeating the on and off operation of the DC output from the DC power source at a high speed by use of a switching element. As a result of this, the same action and effect as in Embodiment 1 can be obtained and the construction of the rectangular high frequency power source can be simplified. As the switching element used in the switching circuit (the chopper circuit) 18, it is possible to use a thyristor, a GTO (a gate turn-off thyristor), an IGBT (an insulated gate bipolar transistor), a MOSFET, a power transistor, and so on. Furthermore, by connecting these switching elements in series and in parallel, it is possible to increase the switching frequency, withstand voltage and withstand current and the frequency of a rectangular wave capable of being applied to the wafer can be increased to about several MHz. Also, by controlling the on-off signal of the switching element, a voltage waveform in which an absolute value of high frequency voltage increases with time as shown in FIG. 3 is generated. Therefore, the same action and effect as in Embodiment 1 are obtained even by applying this high frequency voltage to the wafer chucking electrode 9. In this case, the high frequency voltage waveform control circuit (sag correction circuit) 12 can be omitted, and the automatic control of the switching circuit 18 (the chopper circuit) is performed by using, for example, a signal from the electrode current monitor 15 as a monitored quantity.

Embodiment 3

The third embodiment of the present invention will be described with reference to FIG. 14 to FIG. 19. In this figure, the same reference numerals as in FIG. 1 indicate the same parts and hence the descriptions of these parts are omitted. Points of this figure which are different from FIGS. 1 and 2 will be described below. The rectangular high frequency power source 13 is constituted by a sine wave output power source 19. A sine wave voltage waveform output from the sine wave output power source 19 is clipped by the high frequency voltage waveform control circuit (sag correction circuit) 12, and a voltage waveform in which an absolute value of voltage in a clipped portion increases with time is generated. As a result of this, it becomes possible to apply a waveform close to a rectangular high frequency voltage waveform to the wafer. This enables the same action and effect as in Embodiment 1 to be obtained and the construction of the rectangular high frequency power source to be simplified.

FIG. 15(B) shows a waveform in which sag ratio of 0% was achieved in a wafer by clipping sine wave voltage waveform. Control was performed so that the sag ratio becomes 0% at the wafer potential by varying the clip voltage to −400 V and −200 V for a sine wave voltage waveform of $V_{pp}$ 700 V with sag correction. FIG. 15(A) shows three-dimensionally the result of the measurement of the ion energy distribution in each wafer voltage waveform. Although in a sine wave voltage waveform of $V_{pp}$ 700 V the proportions of the quantity of ions at a high energy peak and a low energy peak are each about 50%, the quantity of ions at the high energy peak is increased by setting the clip voltage at −400 V and −200 V and the period of the flat part. In other words, an ion energy distribution close to a monochromatic one can be obtained. When the peak quantity of ions on the low energy side is denoted by $P_L$ and the peak quantity of ions on the high energy side by $P_H$, the high energy peak ratio is defined as follows:

[Formula 3]

$$\text{High energy peak ratio (\%)} = \frac{P_H}{P_L + P_H} \times 100 \qquad (3)$$

FIG. 17 shows the $V_{pp}$ dependence of the high energy peak ratio. The high energy peak ratio of an ideal monochromatic ion energy distribution is 100%, whereas the high energy peak ratio is about 50% in a conventional sine wave bias. In the sine wave clip voltage waveform with sag ratio of 0% shown in FIG. 15(A), the high energy peak ratio can be increased to about 85%.

Figure 19:
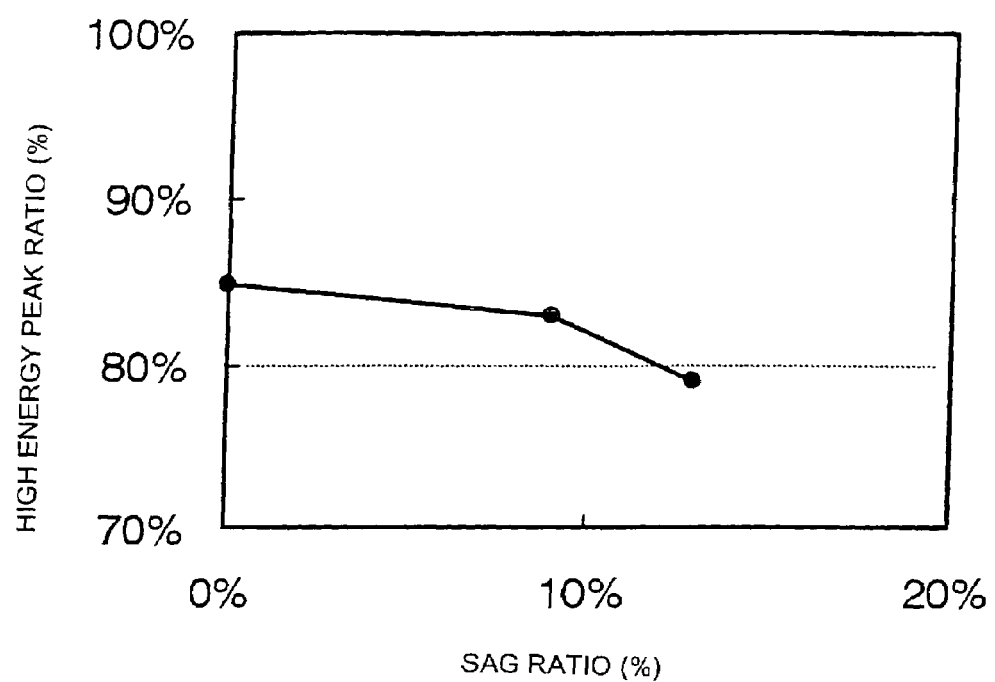
FIG. 19 is a diagram showing the dependence of the high energy peak ratio on the ratio of amount of sag according to an embodiment of the present invention.

The dependence of the ion energy distribution on the sag ratio is shown in FIG. 18(A). FIG. 18(B) shows a wafer voltage waveform which was compensated for in terms of sag and in which the sag ratio was varied at the wafer potential from 0% to 13%, and FIG. 18(A) shows three-dimensionally the result of the measurement of the ion energy distribution at each ratio of the amount of sag. When the sag ratio increases, the peak quantity of ions on the high energy side $P_H$ decreases. FIG. 19 shows the dependence of the high energy peak ratio on the sag ratio. When the high energy peak ratio is 80% or greater, the ratio of the amount of sag must be not more than 10% in order to achieve an ion energy distribution close to a monochromatic one.

Although in the above embodiments the frequency of the rectangular high frequency power source 13 was 400 kHz and 800 kHz, a frequency in the range of 10 kHz to 4 MHz or so is preferred in consideration of the follow-up action of ions to alternating electric fields, and a frequency in the range of 100 kHz to 2 MHz or so is preferred in consideration of the incidence efficiency of ions on the wafer.

Although in the above embodiments a description was given of the example of an etching apparatus based on the use of a magnetic field UHF discharge, the same action and effect can be obtained also from a dry etching apparatus which utilizes other discharges (a magnetic field microwave discharge, a capacitive coupled discharge, an inductively coupled discharge, a magnetron discharge, a surface wave excitation discharge, and a transfer coupled discharge). Although in the above embodiments a description was given of an etching apparatus, the same action and effect can be obtained also from other plasma processing apparatus which perform plasma processing, such as a plasma CVD apparatus, an ashing apparatus and a surface modification apparatus.

What is claimed is:

1. A plasma processing apparatus, comprising:

a plasma generation means which generates plasma within the interior of a processing chamber;

a means for applying a high frequency voltage to an object to be processed;

a processing chamber to which a vacuum system is connected and the interior of which can be depressurized;

a gas supply device which supplies a gas to the interior of the processing chamber;

a substrate electrode disposed in the processing chamber, where the object to be processed is placed on the substrate electrode which is coated with a dielectric film; and a substrate bias power source which supplies a substrate bias voltage to the substrate electrode;

wherein the substrate bias power source includes a rectangular wave power source which generates a substantially rectangular wave, and a clip circuit, the clip circuit comprising:

a diode which removes at least one of a positive side and a negative side of a high frequency voltage waveform being output from the substrate bias power source and performs a voltage waveform operation so as to obtain a flat voltage waveform portion with time; and a circuit having a transistor and a capacitor which generates a inclined portion to increase with time an absolute value of voltage on at least either of the positive side or the negative side of said that voltage waveform portion;

wherein the high frequency voltage waveform is controlled so as to be the voltage waveform in which a positive constant voltage and a negative constant voltage alternate with each other at given cycles.

2. A plasma processing apparatus, comprising:

a plasma generation means which generates plasma within the interior of a processing chamber;

a means for applying a high frequency voltage to an object to be processed;

a processing chamber to which a vacuum system is connected and the interior of which can be depressurized;

a gas supply device which supplies a gas to the interior of the processing chamber;

a substrate electrode disposed in the processing chamber, where the object to be processed is placed on the substrate electrode which is coated with a dielectric film; and a substrate bias power source which supplies a substrate bias voltage to the substrate electrode;

wherein the substrate bias power source includes a rectangular wave power source which generates a substantially rectangular wave, and a clip circuit, the clip circuit comprising:

a diode which removes at least one of a positive side and a negative side of a high frequency voltage waveform being output from the substrate bias power source and performs a voltage waveform operation so as to obtain a flat voltage waveform portion with time; and a circuit having a transistor and a capacitor which generates a inclined portion to increase with time an absolute value of voltage on at least either of the positive side or the negative side of said voltage waveform portion.

3. The plasma processing apparatus according to claim 1 or 2, wherein the means for applying a high frequency voltage, which becomes a voltage waveform in which a positive constant voltage and a negative constant voltage alternate with each other at given cycles, is constituted by a DC power source and a switching circuit (a chopper circuit).

4. The plasma processing apparatus according to claim 1 or 2, wherein the means for applying a high frequency voltage, which becomes a voltage waveform in which a positive constant voltage and a negative constant voltage alternate with each other at given cycles, is constituted by a DC power source and a switching circuit (a chopper circuit), which uses as switch elements a thyristor, a GTO (a gate turn-off thyristor), an IGBT (an insulated gate bipolar transistor), a MOSFET and a power transistor.

5. The plasma processing apparatus according to claim 1 or 2, wherein in the substrate bias power source, the duty ratio of the rectangular wave is variable 6. The plasma processing apparatus according to claim 1 or 2, wherein the means for applying a high frequency voltage, which becomes a voltage waveform in which a positive constant voltage and a negative constant voltage alternate with each other at given cycles, is constituted by a sine wave output power source.

7. The plasma processing apparatus according to claim 1 or 2, wherein the substrate bias power source has a frequency in the range of 10 KHz to 4 MHz.

8. The plasma processing apparatus according to claim 2, wherein the clip circuit has the function of monitoring at least any one of a current of an wafer chucking electrode, a voltage generated in the object to be processed, a current which flows into the object to be processed, a voltage of the wafer chucking electrode, a power applied to the object to be processed and an output power of the high frequency power source, increasing with time an absolute value of voltage on at least either of the positive side and the negative side of said rectangular high frequency voltage waveform to said monitored quantity, and performing control so that the high frequency voltage waveform generated in the object to be processed becomes substantially rectangular.

* * * * *